United States Patent [19]

Nath et al.

[11] Patent Number: 4,507,181

[45] Date of Patent: Mar. 26, 1985

[54] METHOD OF ELECTRO-COATING A SEMICONDUCTOR DEVICE

[75] Inventors: Prem Nath, Rochester; Timothy J. Barnard, Lake Orion; Dominic Crea, Mt. Clemens, all of Mich.

[73] Assignee: Energy Conversion Devices, Inc., Troy, Mich.

[21] Appl. No.: 581,499

[22] Filed: Feb. 17, 1984

[51] Int. Cl.³ ............... C25D 5/02; C25D 5/10; C25D 7/12
[52] U.S. Cl. ........................ 204/15; 204/38.3; 204/40
[58] Field of Search ............ 204/15, 38 R, 38 A, 204/38 B, 40

[56] References Cited

U.S. PATENT DOCUMENTS

| | | | |
|---|---|---|---|
| 4,143,253 | 3/1979 | Wagner | 204/15 |
| 4,144,139 | 3/1979 | Durkee | 204/15 |
| 4,205,428 | 6/1980 | Ernstoff | 204/15 |
| 4,251,327 | 2/1981 | Grenon | 204/15 |
| 4,320,250 | 3/1982 | Corwin | 204/15 |
| 4,322,571 | 3/1982 | Stanbery | 204/15 |
| 4,399,004 | 8/1983 | Buckley | 204/15 |
| 4,410,758 | 10/1983 | Grolitzer | 204/15 |

*Primary Examiner*—T. Tufariello
*Attorney, Agent, or Firm*—Marvin S. Siskind; Ronald W. Citkowski

[57] ABSTRACT

A non-destructive method of electro-coating a preselected pattern of electrically insulating or conducting material onto a semiconductor device which includes a photoresponsive junction. The method includes the step of illuminating the semiconductor device prior to initiating the flowing of electro-coating current therethrough. The method has particular utility in providing electroplated grid patterns and connections on large area photovoltaic cells. Also disclosed is the use of current generated by a photovoltaic cell to effect the electro-coating thereof.

32 Claims, 12 Drawing Figures

72 MASKING
74 ELECTRO-COATING
76 MASK REMOVAL

CONTINUOUS,
HOMOGENEOUS
LAYER

DISCONTINUOUS,
HOMOGENEOUS
LAYER

CONTINUOUS,
HETEROGENEOUS
LAYER

DISCONTINUOUS
LAYER WITH
HOMOGENEOUS
AND
HETEROGENEOUS
REGIONS

DISCONTINUOUS,
HETEROGENEOUS
LAYER

METHOD OF ELECTRO-COATING A SEMICONDUCTOR DEVICE

FIELD OF THE INVENTION

This invention relates generally to electronic devices and more particularly, to those semiconductor devices which incorporate therein a photoactive junction. Disclosed herein is an electro-coating process for forming a patterned deposit upon a surface of the semiconductor device without adversely affecting the proper functioning of the device.

BACKGROUND OF THE INVENTION

In its broadest sense, this invention is directed to a method of forming high quality, patterned deposits upon semiconductor devices through the use of a non-destructive electro-coating process, and has particular utility in the manufacture of photovoltaic devices. In the fabrication of relatively large area photovoltaic devices, it is often desirable to include a relatively high conductivity metallic grid pattern upon the light incident surface of the device. This grid pattern provides a low resistance current path for the collection of photogenerated current, thereby decreasing the internal resistance of the photovoltaic device and increasing its efficiency. Such a grid pattern can be deposited by the method steps of the instant invention.

Many other semiconductor devices also require the deposition of a patterned layer of electrically insulating or electrically conducting material thereupon as one step in the fabrication thereof, said patterned layer of material thereby defining electrically conductive or electrically insulating regions upon the semiconductor device. For example, many semiconductor devices incorporate electrically insulating regions upon a surface thereof in order to prevent short circuiting of the device at points of contact with other devices, support members, associated circuitry, etc. More particularly, and as is well known to those skilled in the art of MOS transistor fabrication and design, an electrically insulating oxide must be provided atop the semiconductor layer so as to insulate that layer from the gate electrode. The insulating oxide may be efficiently and cost effectively deposited by the novel method described herein.

It is also desirable in many instances to include a pattern of electrically conductive regions upon a surface of a semiconductor device. Such conductive regions may be used to interconnect various circuit elements so as to form integrated circuitry. In other cases, a pattern of electrically conductive regions may be formed upon a semiconductor device to provide contact points for electrically connecting the device to other devices or circuitry. As a still further example of the use of the method of the instant invention, photovoltaic devices may include a metallic layer on the rear surface thereof for use as a back reflector. In such photovoltaic devices, the reflective layer is disposed at the back surface (i.e., distal from the surface upon which light is incident), and functions to redirect light which has made a first pass through the active regions thereof through those active regions, thereby increasing overall device efficiency. Both the patterns of electrically conductive regions and the back reflector layer may be effectively deposited pursuant to the concepts discussed herein.

In summation and as is readily apparent from the foregoing discussion, it is desirable to provide a pattern of electrically insulating material and/or electrically conducting material upon a surface of semiconductor devices. The instant invention provides an improved method for electro-coating such patterns without harming the semiconductor device. In view of the number of diverse functions and geometries of the patterns formed upon semiconductor devices, the terms "pattern" or "electro-coated region", as used herein, are defined to include coated regions of all sizes, configurations and thicknesses; including, but not limited to continuous layers, discontinuous layers, stripes, grids, networks, etc., which are deposited upon a surface of the semiconductor device. The foregoing definitions are not limited by the function of the deposited pattern, but, rather include patterns which function as electrical conductors, thermal conductors, light reflectors, heat reflectors, electrical insulators, anti-reflective layers, decorative trim, etc.

The methods heretofore used to deposit patterned regions upon a surface of a semiconductor device have proven less than satisfactory. Vacuum coating processes such as sputtering, evaporation, or ion-plating represent one prior art method of providing such patterned regions. However, vacuum coating processes have inherent limitations which render them undesirable. More particularly, vacuum coating processes (1) require a vacuum, thereby utilizing relatively expensive and complicated equipment; (2) are time consuming; and (3) require skilled operators. Additionally, vacuum coating process deposit continuous layers which must be etched, scribed or otherwise formed into the desired pattern is a subsequent processing step.

In other prior art methods the patterned regions are applied upon a surface of a semiconductor device in a printing process. Materials such as (1) electrically conductive or electrically insulating ink may be applied to the surface of a semiconductor device by an offset type printing process, or (2) electrically conductive or electrically insulating paste may be applied to the device through a stenciling or screen printing process. These deposition techniques, while inexpensive, result in the application of materials having limited utility in semiconductor devices, since they incorporate organic binders which either contaminate the electronic device produced therefrom, or interfere with further processing steps. Also, resolution of the printing processes used to deposit these inks and pastes is generally insufficient to apply the finely detailed patterns which are often necessary for microelectronic devices. The aforementioned materials, generally have relatively low electrical conductivities and therefore must be applied in thick layers in order to provide adequate electrical performance. Since thick layers are not compatible with thin film semiconductor layers, printing processes are of limited use in the manufacture of thin film semiconductor devices. Additionally, the inks used in these printing processes must generally be cured at relatively high temperatures if optimum stability and performance is to be obtained, and such elevated temperatures are incompatibile with many semiconductor materials. Furthermore, (1) it is difficult to provide soldered joints to such organic binder-containing materials, and (2) reliability and serviceability of such relatively thick patterned regions is inadequate, since they are subject to mechanical damage and are degraded by ultraviolet radiation.

A further variation of the aforementioned prior art printing process, said variation limited to the production of electrically conductive patterns only, involves the use of metal resinates. These commercially available materials comprise metallic atoms complexed with an organic material. In use, the resinates are (1) applied to the substrate in a desired pattern, and (2) fired at high temperatures so as to volatize the organic material, thereby leaving a residue layer of metal which forms the electrically conductive patterned regions. While the metallic layer thus deposited provides sufficient electrical conductance for many of the purposes discussed hereinabove, the high cost of the metal resinates, the time consuming nature of the process, and the high temperatures required to volatize the organic material severely limit the use of this technique. For example, even disregarding cost, the metal resinate technique could not be utilized to form contacts or grid patterns on thin film amorphous photovoltaic devices, since the high processing temperatures (300°–600° C.) would crystallize the amorphous semiconductor layers. Further, and obviously, metal resinates could not be used to form electrically insulating patterns. Accordingly, they are of little use in the fabrication of semiconductor devices.

Electroless, or autocatalytic, plating represents a partial solution to the problems associated with the deposition of electrically conductive patterns, such as metallic contacts, upon semiconductor devices. However, such a plating technique has no utility in the deposition of electrically insulating patterns. In electroless plating, (1) the member to be metallized is treated with an appropriate activating material for catalyzing the precipitation of a metallic deposit thereon, and (2) is then immersed in a plating bath in which the deposition of a metal occurs. Under ideal conditions, the metal so deposited is satisfactory, although use of the process is limited by (1) its high costs, (2) the difficulty of implementation, and (3) its restriction to a limited range of metallic deposits. More particularly, the cost of electroless plating is more than an order of magnitude greater than a comparable electroplating process; the parameters of the process must be closely monitored in order to assure the formation of a good electrically conductive coating, and nickel and copper are the only readily available metals that may be deposited by the process. More specifically, if tolerances relating to temperature, concentration, or purity of the activating and plating baths are not closely maintained, the electrically conductive material deposited onto the surface of a semiconductor device will exhibit problems of adhesion, surface quality, durability and composition. For these reasons, electroless plating techniques require the use of highly trained personnel to constantly monitor system parameters.

Electro-coating provides a non-destructive, easily implemented, and economical method of depositing high quality, pure, thin layers of electrically conductive and/or electrically insulating material upon a surface of a semiconductor device. The term "electro-coating", as used herein, shall define a process wherein an electrically charged ion is supplied to the surface of the object upon which material is to be deposited, thereby causing the formation of an electro-coated deposit. Electro-coating includes various electroplating processes wherein an electrical field applied to the surface reduces an ionic species initially in solution causing that species to plate out of the solution and form a deposited layer on the surface being coated. Electro-coating also includes oxidative processes such as anodization, wherein the electrical field applied to the surface being coated causes the surface to react chemically with oxygen ions in contact therewith so as to deposit an oxide layer upon the charged surface. Electro-coating also includes other oxidative processes, whereby the applied field produces deposits of nitrides, sulfides, borides, or similar species upon the object being coated. Electro-coating processes have the advantage of being inexpensive, easy to control and adaptable to the deposition of a wide variety of materials. And since the thickness of an electro-coated deposit is directly proportional to the amount of current utilized, the thickness can be closely controlled. Accordingly, electro-coating techniques are gaining acceptance as a method of depositing electrically conductive layers in the preparation of semiconductor devices. For example, U.S. patent application Ser. No. 524,797 of Prem Nath, et al, filed Aug. 19, 1983 and entitled METHOD OF FORMING AN ELECTRICALLY CONDUCTIVE MEMBER, which application is assigned to the assignee of the instant invention, the disclosure of which is incorporated herein by reference, discloses a method for electroplating an electrically conductive pattern onto a transparent conductive oxide layer of a semiconductor device such as a photovoltaic cell.

The disclosure of Nath, et al recognizes a problem which has heretofore limited the use of electro-coating processes in the fabrication of semiconductor devices. In particular: an electrical current must pass through the material in order to effect the electro-coating; however, the passage of such current through the layers of semiconductor material frequently destroys or severely harms the electrical characteristics of those semiconductor layers. Furthermore, the relatively high electrical resistivities encountered in most common semiconductor materials necessitates that current must flow therethrough at relatively high voltages in order to initiate the coating process, thus further increasing the likelihood of damage to the semiconductor device. As a result, electro-coating processes are of limited utility as applied to semiconductor devices because of the likelihood of damage to the semiconductor devices due to high coating currents and voltages. In response to this problem, Nath, et al specifies that it is desirable to establish electrical contact to the semiconductor device via the surface being plated, thereby eliminating the flow of plating currents through the active semiconductor material of the device. Such contact is practical in Nath, et al since the surface of the semiconductor device being plated has a transparent conductive oxide layer of relatively high electrical conductivity thereupon.

In many cases it is not possible, or not practical to utilize the aforementioned electro-coating method of Nath, et al to make electrical contact to the surface of the semiconductor device being electro-coated. Electrical resistance of semiconductor materials is high, and unless a relatively high electrical conductivity layer, such as the TCO layer of Nath, et al, is included upon the surface of the semiconductor device being electro-coated, lateral resistance of the device to the flow of electrical current will be extremely high. This will result in an inadequate flow of current to those portions of the surface of the device relatively distant from the point at which electrical contact is established, thereby resulting in the deposition of a varying thickness of material across the surface of the semiconductor device. Further, due to the relatively low electrical resistance of the relatively thin layer of semiconductor material in a direction perpendicular to the plane of the surface of the device, the majority of the electro-coating current will flow perpendicularly through the semiconductor material of the device from the point of contact, thereby causing the failure problems previously discussed.

An electro-coating process specifically adapted for use in the preparation of semiconductor devices that is restricted to front-surface contact is of limited utility in the deposition of electrically conductive grid patterns upon large area photovoltaic devices. This is because such large area devices are generally divided into a plurality of electrically isolated photovoltaic segments disposed upon a common electrically conductive substrate. If the electrical current for electro-coating a large area photovoltaic device were to be provided to the front surface of such a device, contact would have to be individually established to each of the plurality of isolated segments since there is no electrical communication therebetween, thus involving a very tedious process. Obviously, it is desirable to establish a single electrical contact through the common substrate which would provide for the electro-coating of the front surface of each of the plurality of electrically isolated segments. According to the prior art methods, such rear-surface contact could not be accomplished without severely damaging the isolated segments.

Accordingly, it can be seen that there exists a need for a method of electro-coating semiconductor devices which will allow electrical current to pass through the semiconductor material of the semiconductor device without damaging same. This need is especially great in the fabrication of large area photovoltaic cells comprising a plurality of discrete, electrically isolated segments which are disposed upon a common, electrically conductive substrate.

Recently, considerable efforts have been made to develop systems for depositing amorphous semiconductor alloy materials, each of which can encompass relatively large areas, and which can be doped to form p-type and n-type materials for the production of p-i-n type photovoltaic devices which are, in operation, substantially equivalent to their crystalline counterparts. It is to be noted that the term "amorphous", as used herein, includes all materials or alloys which have long range disorder, although they may have short or intermediate range order or even contain, at times, crystalline inclusions.

It is now possible to prepare amorphous silicon alloys by glow discharge deposition or vacuum deposition techniques, said alloys possessing (1) acceptable concentrations of localized states in the energy gaps thereof, and (2) high quality electronic properties. Such techniques are fully described in U.S. Pat. No. 4,226,898, entitled Amorphous Semiconductors Equivalent To Crystalline Semiconductors, issued to Stanford R. Ovshinsky and Arun Madan on Oct. 7, 1980; U.S. Pat. No. 4,217,374, of Stanford R. Ovshinsky and Masatsugu Izu, which issued on Aug. 12, 1980, also entitled Amorphous Semiconductors Equivalent To Crystalline Semiconductors; and U.S. patent application Ser. No. 423,424 of Stanford R. Ovshinsky, David D. Allred, Lee Walter, and Stephen J. Hudgens entitled Method of Making Amorphous Semiconductor Alloys and Devices Using Microwave Energy. As disclosed in these patents and application, fluorine introduced into the amorphous silicon semiconductor layers operates to substantially reduce the density of the localized states therein and facilitates the addition of other alloying materials, such as germanium.

The concept of utilizing multiple cells, to enhance photovoltaic device efficiency, was described at least as early as 1955 by E. D. Jackson in U.S. Pat. No. 2,949,498 issued Aug. 16, 1960. The multiple cell structures therein discussed utilized p-n junction crystalline semiconductor devices. Essentially the concept employed different band gap devices to more efficiently collect various portions of the solar spectrum and to increase open circuit voltage (Voc). The tandem cell device (by definition) has two or more cells with the light directed serially through each cell. In the first cell a large band gap material absorbs only the short wavelength light, while in subsequent cells smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant.

Unlike crystalline silicon which is limited to batch processing for the manufacture of solar cells, amorphous silicon alloys can be deposited in multiple layers over large area substrates to form solar cells in a high volume, continuous processing sytem. Such continuous processing systems are disclosed in U.S. Pat. No. 4,400,409 for A Method Of Making P-Doped Silicon Films and Devices Made Therefrom; and U.S. patent applications: Ser. No. 244,386, filed Mar. 16, 1981, for Continuous Systems For Depositing Amorphous Semiconductor Material; Ser. No. 240,493, filed Mar. 16, 1981, for Continuous Amorphous Solar Cell Production System; Ser. No. 306,146, filed Sept. 28, 1981, for Multiple Chamber Deposition And Isolation System And Method: Ser. No. 359,825, filed Mar. 19, 1982 for Method And Apparatus For Continuously Producing Tandem Amorphous Photovoltaic Cells; and Ser. No. 460,629 filed Jan. 24, 1983 for Method And Apparatus For Continuously Producing Tandem Amorphous Photovoltaic Cells. As disclosed in the above patent and the applications, a substrate may be continuously advanced through a succession of deposition chambers, wherein each chamber is dedicated to the deposition of a specific semiconductor material. In making a photovoltaic device of p-i-n type configurations, the first chamber is dedicated for depositing a p-type semiconductor alloy, the second chamber is dedicated for depositing an intrinsic amorphous semiconductor alloy, and the third chamber is dedicated for depositing an n-type semiconductor alloy.

The layers of semiconductor material thus deposited in the vacuum envelope of the deposition apparatus may be utilized to form a photovoltaic device including one or more p-i-n cells, one or more n-i-p cells, a Schottky barrier, photodiodes, phototransistors, or the like. Additionally, by making multiple passes through the succession of deposition chambers, or by providing an additional array of deposition chambers, multiple stacked cells of various configurations may be obtained.

In many cases, it is necessary to form patterns of electrically conductive or electrically insulating regions such as grids, networks, protective layers, etc. atop the previously deposited amorphous semiconductor material. In other cases, it is desirable to incorporate a reflective metallic back reflector in photovoltaic devices so as to redirect light through the active semiconductor material of the device for a second time. The instant invention may be utilized in the production of all of these devices insofar as it offers a method for economically, and reliably producing said patterns by a process which does not destroy the amorphous semiconductor material of the devices. Accordingly, the instant invention fulfills a long felt need in the production of semiconductor devices in general, and has special significance in the production of amorphous photovoltaic devices.

These and other advantages of the instant invention will become apparent from the drawings, the detailed description of the invention and the claims which follow.

BRIEF SUMMARY OF THE INVENTION

The present invention discloses an improved method for electro-coating a preselected pattern upon a first surface of a semiconductor device, said device including a photoresponsive junction disposed between the first surface and a second surface thereof. The method includes the steps of: disposing the semiconductor device in an electro-coating apparatus which includes an electrolyte bath; illuminating the device to activate the photoresponsive junction, and providing electrical current to the second surface of the semiconductor device. Under illumination, the photoresponsive junction allows a relatively unimpeded flow of current from the second surface to the first surface of the semiconductor device, whereby a patterned electro-coated deposit is formed upon the first surface thereof. In those instances in which the semiconductor device being electro-coated is a photovoltaic device, it is possible to utilize the photogenerated current from the illuminated semiconductor device to form the electro-coated deposit thereupon.

According to the aforementioned method of the instant invention, electrically conductive and/or electrically insulating patterns may be formed upon a surface of the semiconductor device by (1) utilizing a resist pattern to restrict the areas in which the electro-coating process can occur; (2) electro-coating a continuous layer upon a surface of the device, the layer being subsequently etched to provide the shape of the desired pattern, or (3) projecting a preselected pattern, corresponding to the pattern to be electro-coated, onto the device while it is immersed in the electrolyte bath. Pursuant to the inventive teachings embodied herein, insulating coatings such as oxides and nitrides, as well as conductive coatings, such as metals may be deposited upon a variety of semiconductor devices such as photovoltaic cells, diodes, transistors, integrated circuits, etc. by utilizing a process which is rapid, economical, easy to implement, and non-destructive of the semiconductor material.

DETAILED DESCRIPTION OF THE DRAWINGS

I. The Photovoltaic Device

Figure 1:
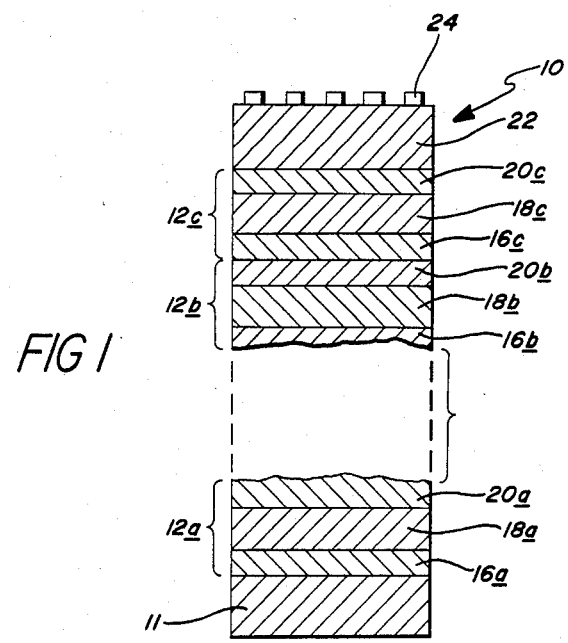
FIG. 1 is a fragmentary, cross-sectional view of a tandem photovoltaic cell comprising a plurality of p-i-n type cells, each layer of the cells including an amorphous semiconductor alloy.

Referring now to the drawings and particularly to FIG. 1, a photovoltaic cell formed of a plurality of successive p-i-n layers, each of which include a semiconductor alloy, is shown generally by the numeral 10. The electro-coating method of the instant invention is specifically adapted for use in the fabrication of cells of this type.

More particularly, FIG. 1 shows a p-i-n type photovoltaic device such as a solar cell made up of individual p-i-n type cells 12a, 12b and 12c. Below the lowermost cell 12a is a substrate 11, which (1) forms the second surface of the cell 10, (2) functions as the bottom electrode, and (3) may be transparent or formed from a metallic material such as stainless steel, aluminum, tantalum, molybdenum or chromium, with or without an insulating layer thereon, or an insulating material such as glass with or without metallic particles embedded therein. Although certain applications may require a thin oxide layer and/or a series of base contacts prior to deposition of the semiconductor material, for purposes of this application, the term, "substrate" shall include not only a flexible film, but also any elements added thereto by preliminary processing. The instant invention provides a method for depositing these elements, as will become apparent from the description which follows.

Each of the cells, 12a, 12b and 12c are fabricated with an amorphous semiconductor body containing at least a silicon or germanium alloy. Each of the semiconductor bodies includes an n-type conductivity semiconductor layer 20a, 20b and 20c; an intrinsic semiconductor layer 18a, 18b and 18c; and a p-type conductivity semiconductor layer 16a, 16b and 16c. As illustrated, cell 12b is an intermediate cell and, as indicated in FIG. 1, additional intermediate cells may be stacked atop the illustrated cells without departing from the spirit or scope of the present invention.

It is to be understood that following the deposition of the semiconductor layers, a further deposition process may be either performed in a separate environment or as a part of a continuous process. In this step, a TCO layer 22, formed in the preferred embodiment of indium tin oxide, also referred to herein as the top or upper electrode or first surface of the device 10, is deposited atop the semiconductor material. A metallic pattern in the form of an electrode grid 24 may be applied to the device where the cell is of a sufficiently large area, or if the conductivity of the TCO layer 22 is insufficient. The grid 24 shortens the carrier path through the TCO and thus increases the conduction efficiency. The instant invention is specifically directed toward methods for the fabrication of, inter alia, metallic patterns, such as the grid 24, or other like conductive networks onto a surface of semiconductor devices.

While the cell illustrated in FIG. 1 is a stacked assembly of p-i-n type photovoltaic cells, the instant invention also has utility in the fabrication of other electronic devices such as single p-i-n cells, stacked or single n-i-p cells, p-n cells, Schottky barrier cells, transistors, diodes, integrated circuits, photodectors, and other semiconductor devices.

Figure 2:
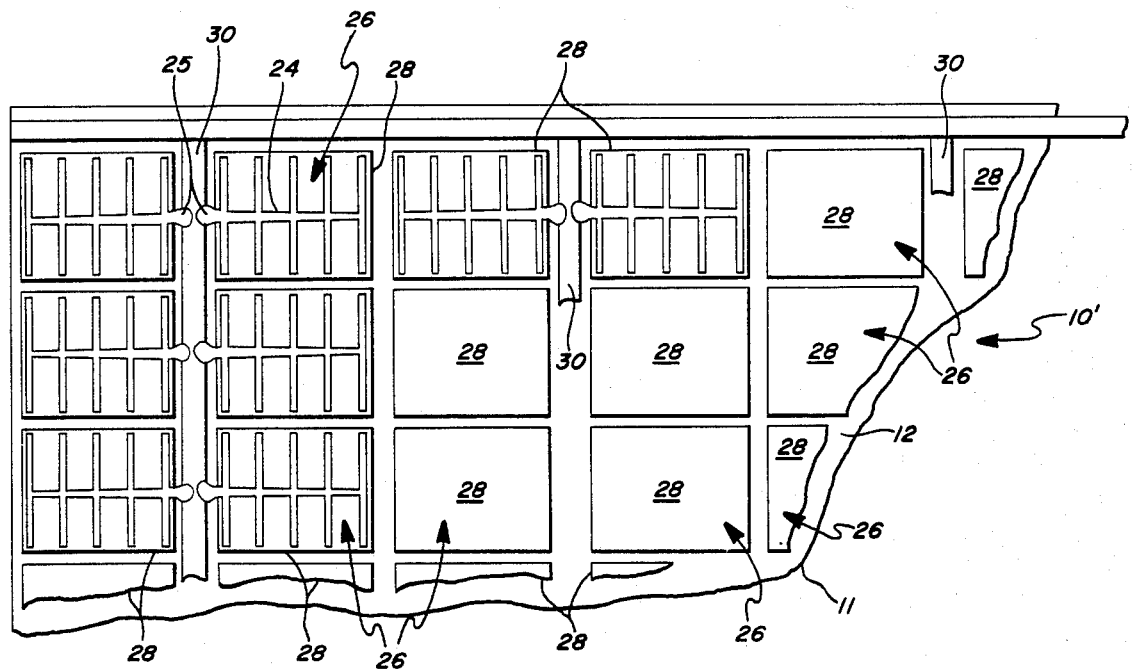
FIG. 2 is a fragmentary top plan view of a large area photovoltaic device comprising a plurality of small area isolated cells, each of which includes an electrically conductive grid pattern formed according to the principles of the instant invention.

FIG. 2 is a fragmentary top plan view of a large area photovoltaic device 10' generally similar to the device depicted in cross section in FIG. 1. As can be seen from FIG. 2, the large area device 10' includes a continuous, large area substrate 11 having a continuous layer of semiconductive material 12 deposited thereon. The surface of the semiconductor material 12 of the large area photovoltaic device 10' has a plurality of electrically isolated portions 26 formed thereon, each of said isolated portions 26 adapted to contribute to the total electrical output of the large area device 10'.

As should be apparent, each of the isolated portions 26 share a common continuous substrate 11 which forms a common bottom electrode, hereinafter also referred to as the "second surface". The electrically isolated portions 26 of the semiconductor material 12 are formed by discrete regions 28 of the transparent conductive oxide material which has been provided atop the semiconductor material 12 so that each of these discrete regions 28 functions as the upper electrode of an individual small area photovoltaic cell. The individual small area cells 26 thus formed are electrically isolated from adjacent small area cells because the relatively high conductivity TCO layer 22 collects current from the semiconductor material 12 directly thereunder, while the high lateral electrical resistivity of the semiconductor material 12 prevents electrical current from flowing laterally between the discrete regions 26.

Deposited atop each of the electrically isolated portions 26 is a current collection grid 24, previously described, which functions to provide a low resistance current path across each of the transparent conductive oxide segments 28 formed on the large area device 10', thereby decreasing electrical resistance further, and improving current collection. The grid 24 of each electrically isolated small area portion 26 is connected to a system of busbars 30 which convey photogenerated current collected from each of the portions 26 to a central collection point. The grids 24 are shown connected to the busbars 30 by connectors 25, such as dots of silver paste. In some applications it is desirable not to initially connect the grid 24 to the busbars 30 thus allowing for electrical testing of each isolated portion 26 so as to only connect the portions 26 found to be electrically operable (provide a predetermined electric current).

The busbars 30, the connectors 25 and the conductive grid 24 are desirably fabricated of a material having a relatively high electrical conductivity such as a metallic material. It is the principle object of the instant invention to provide a method for the fabrication of the grids 24, connectors 25 and/or the busbar system 30 through an electroplating process.

II. Depositing the Electro-coated Pattern

Figure 3:
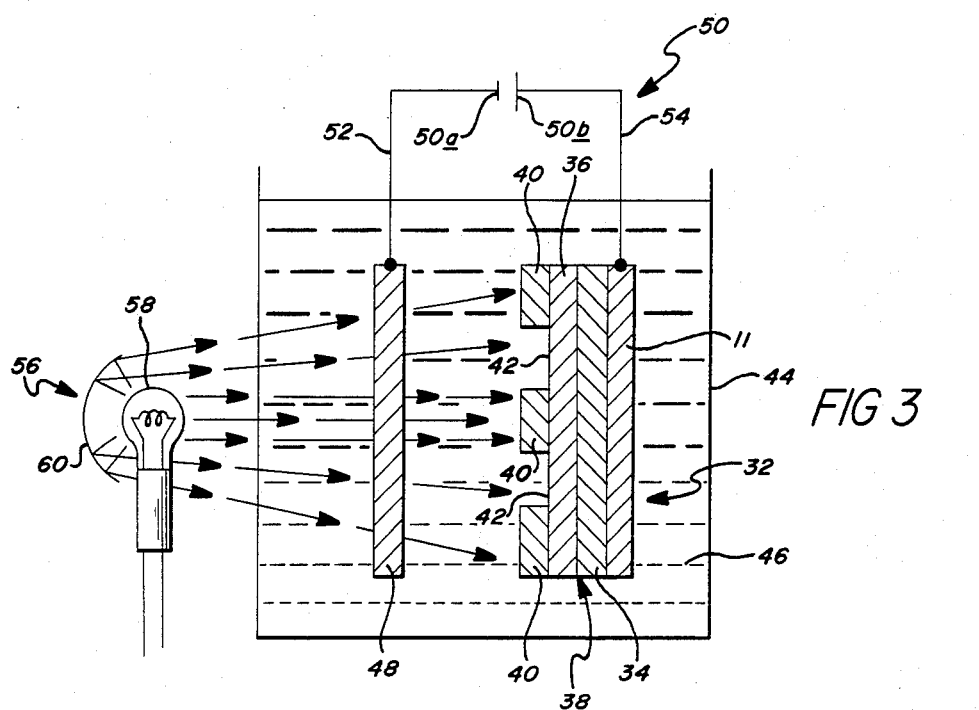
FIG. 3 is a schematic representation of batch process apparatus adapted to electro-coat a preselected pattern onto a semiconductor device.

Referring now to FIG. 3, the instant invention will be described with reference to electroplating apparatus adapted to electro-coat a metallic material onto the first surface of a semiconductor device 32, depicted therein as a p-n junction device. It is to be understood that the p-n junction device 32 is merely representative of a typical photoresponsive device such as a diode, a photovoltaic cell, a light emitting diode, etc. which incorporates a photoactive junction. The term "photoactive junction" will be used herein as referring to a junction which includes at least one semiconductor material, said junction capable of either (1) generating current carriers, i.e. electrons and/or holes, or (2) conducting a current, in response to absorbed photons. The semiconductor device 32 includes (1) a substrate layer 11 formed of an electrically conductive material such as stainless steel, (2) a layer of p-type conductivity semiconductor material 34 disposed thereupon, and (3) a layer of n-type conductivity semiconductor material 36 disposed atop and generally coextensive with the p-type semiconductor material 34. The p-type and n-type semiconductor layers form a p-n junction 38 at the interface therebetween. Obviously, the process described by the instant invention is not limited to p-n semiconductor devices but, rather, may be utilized to electro-coat any semiconductor device having a photoactive junction. Furthermore, the method is not solely limited to electroplating but may be utilized in conjunction with any electro-coating process wherein electrical current flows through a semiconductor device.

The n-type conductivity layer 36 comprises the "first surface" (as used herein, the term "first surface" will refer to the light incident surface) of the semiconductor device 32, and has formed thereon a preselected pattern 40 of electroplating resist material. The resist material pattern 40 defines non-resist coated regions 42 upon which the metallic material will be subsequently electroplated so as to form the electrically conductive pattern. The electroplating resist material pattern 40 may be formed by any technique well known in the art such as screen printing, offset printing, stenciling, photolithography, etc. and is preferably formed by depositing materials such as lacquer, synthetic resins, and the like. One material having particular utility for the formation of an electroplating resist pattern is MacuMask 9251-M manufactured by the McDermid Corporation. Alternatively, the entire first surface of the semiconductor device 32 may first be electro-coated, and selected regions 42 of the coating subsequently removed by masking and etching, or some other like method for fashioning the desired pattern.

The semiconductor device 32 is placed in a suitable container 44 having an electroplating bath 46 therein. Also placed in the container 34 is a second electrode 48, referred to as a counter-electrode. The composition of the plating bath 46 and the counter-electrode 48 is dependent upon the particular metallic material being electroplated onto the semiconductor device 32. A source of electrical current such as a battery 50 has one terminal 50a thereof electrically connected to the counter electrode 48 via a wire 52, while the other terminal 50b thereof is directly connected via a wire 54 to the substrate 11, said substrate forming the second surface of the semiconductor device 32, thereby completing an electrical circuit through the electroplating bath 46.

Also included in the electroplating apparatus is a light source shown generally by the reference numeral 56. The light source depicted in FIG. 3 comprises a lamp, such as a quartz halogen lamp 58, and a reflective shield 60 adapted to direct the radiation from the lamp 58 toward the first surface of the semiconductor device 32. While the lamp shown in FIG. 3 is depicted as an incandescent lamp, other light sources may be used in keeping with the spirit of the instant invention. For example, arc lamps, fluorescent lamps, or even sunlight may be utilized, the only proviso being that the source of illumination 56 be capable of producing wavelengths of light which will be absorbed by the photoactive junction 38 of the semiconductor device 32 to create carrier pairs in the region of the photoactive junction 38. It is these carrier pairs which permit the semiconductor device 32 to pass an electrical current without being degraded or destroyed.

As is obvious from the foregoing, illumination must reach the photoactive junction 38, to generate carrier pairs. If the semiconductor device 32 is illuminated from the same side thereof upon which the electro-coated deposit is being formed, the growing deposit can "shade" the underlying junction and thereby decrease the rate of electro-coating. This self-limitation is generally not a problem if: (1) the electrocoated deposit is relatively transparent, or (2) the deposit is formed in a pattern through the use of an electro-coating resist which is relatively transparent, or (3) the device is illuminated from the side opposite that being electro-coated.

Since the photovoltaic junction of a photovoltaic device generates a potential thereacross under illumination, it is adapted to provide a flux of electrical current. This photogenerated current flux may be utilized to form an electro-coated deposit upon the surface of the photovoltaic device. Thus, the instant invention may provide a "self-energized" process which does not require an external source of current. In the "self-energized" mode of operation of the instant invention, a photovoltaic device capable of generating a sufficient amount of electrical current and voltage when illuminated, need only be placed in an electro-coating bath and llluminated in order to deposit a coating thereupon. Note, however, that it may be desirable to connect the second surface or substrate 11 of the photovoltaic device to an appropriate counter-electrode to increase the efficiency of the process. The thickness of the electro-coated deposit prepared by a "self-energized" process will depend upon the flux of photogenerated electrical current, which in turn depends upon the intensity of the illumination and the efficiency of the photovoltaic device. In this manner, under equivalent illumination, the more efficient the photovoltaic device, the thicker is the electro-coated deposit formed thereupon. Thus, in an electro-coating process for preparing electrically conductive patterns, such as grids and busbars upon the light incident surface of photovoltaic devices, those devices which are the most efficient photocurrent generators, and which therefore require patterns capable of conducting large electrical currents, will form the thickest electro-coated conductive patterns thereupon. In other words, the thickness of the patterns deposited pursuant to the principles of the instant inventions is proportional to the amount of photogenerated current, i.e., the greater the photogenerated current, the thicker the grid pattern.

Figure 4A:
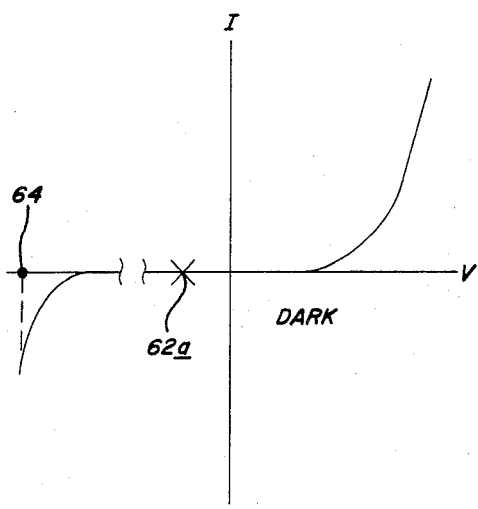
FIG. 4A is a graph of current versus voltage showing the electrical characteristics of an unilluminated semiconductor junction such as the p-i-n junction of the photovoltaic cell depicted in FIG. 1.

The protection which is afforded the semiconductor material of a semiconductor device through the use of the precepts of the instant invention may be explained with reference to FIGS. 4A and 4B which depict typical current-voltage curves for an idealized photoactive junction such as a photovoltaic junction of a photovoltaic cell. FIG. 4A generally illustrates the behavior of the photovoltaic junction in the dark. The junction essentially operates to block the flow of electrical current having a negative polarity, that is to say, a substantial negative voltage must be imposed across the photovoltaic junction in order to initiate the flow of electrical current. At the nominal voltage (indicated by numeral 62a in FIG. 4A) required for an electro-coating process such as an electroplating process to proceed in such a semiconductor device, virtually no electrical current will flow therethrough and electroplating will proceed at a negligible rate, if at all. In order to initiate a sufficient flow of electrical current for electroplating to proceed, a voltage, having at least magnitude indicated by the numeral 64, must be imposed across the device. However, a voltage of such magnitude will degrade or destroy the semiconductor material of the semiconductor device being electro-coated.

Figure 4B:
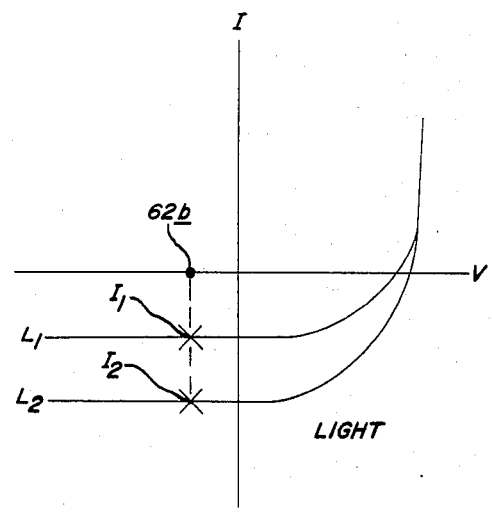
FIG. 4B is a graph of current versus voltage showing the electrical characteristics of a semiconductor junction, such as the p-i-n junction of the photovoltaic cell depicted in FIG. 1, at two different intensities of illumination.

FIG. 4B depicts other current-voltage curves of the same photoactive junction under varying intensities of illumination. It can be seen that both of the current-voltage curves are shifted downward by an amount proportional to the illumination incident upon the photoactive junction. More particularly, curve $L_1$ is indicative of the current-voltage characteristics of the photoactive junction at a first level of illumination and curve $L_2$ is indicative of the current-voltage characteristics of the same junction under more intense illumination. As should be apparent from that figure, at the voltage required for electroplating, indicated by the numeral 62b, the curve indicative of the first level of illumination $L_1$ generates a current $I_1$ through the photoactive junction, and the curve indicative of the second level of illumination $L_2$ generates a greater current $I_2$ through the photoactive junction. In this manner, the amount of electrical current necessary to electro-coat a semiconductor device is controllable by controlling the intensity of illumination incident thereupon. Most importantly, by following the concepts taught by the method of the present invention sufficient electrical current may be passed through the junction of a semiconductor device to enable an electro-coating process to effectively and efficiently proceed at a voltage level which does not destroy or otherwise damage the semiconductor device.

While the process depicted in FIG. 3, the characteristics of which are illustrated in FIG. 4A and 4B, was described as an electroplating process, other electro-coating processes, such as anodization, could be practiced by a similar method in which only the composition of the bath and the polarity of the electrical current flow through the semiconductor device is modified. The term electro-coating will thus be used to encompass within its scope, all such coating processes.

According to the principles of the instant invention, a pattern may be electro-coated atop the semiconductor material via a projection process, rather than through masking and coating, or coating and etching processes. This can be accomplished by utilizing the change in electrical properties exhibited by the illuminated photovoltaic junction of the semiconductor device, as enumerated hereinabove. More specifically, standard projection technology could be employed to project an illuminated pattern onto the semiconductor material of the device. Electrical current will flow through the illuminated regions of the semiconductor device, as discussed with reference to FIGS. 4A and 4B, thereby forming an electro-coated deposit atop and corresponding to, the illuminated areas of the device. The instant projection technique, as advantegously applied to semiconductor device fabrication, eliminates the steps of photoresist deposition, development and removal. Note that said projection technique may also be employed either (1) in conjunction with an externally applied electro-coating current, or (2) in a self-energized process wherein photo-generated electrical current is utilized for electro-coating.

It may be desirable in some cases to employ the projection technique to form a "strike" pattern which then serves as a nucleation pattern for subsequently deposited material. In such a case, a first relatively thin patterned layer is formed by projecting an image, as previously described; the patterned illumination is terminated, and the device is then uniformly illuminated and electrocoated in accord with previously described principles.

Figure 5A:
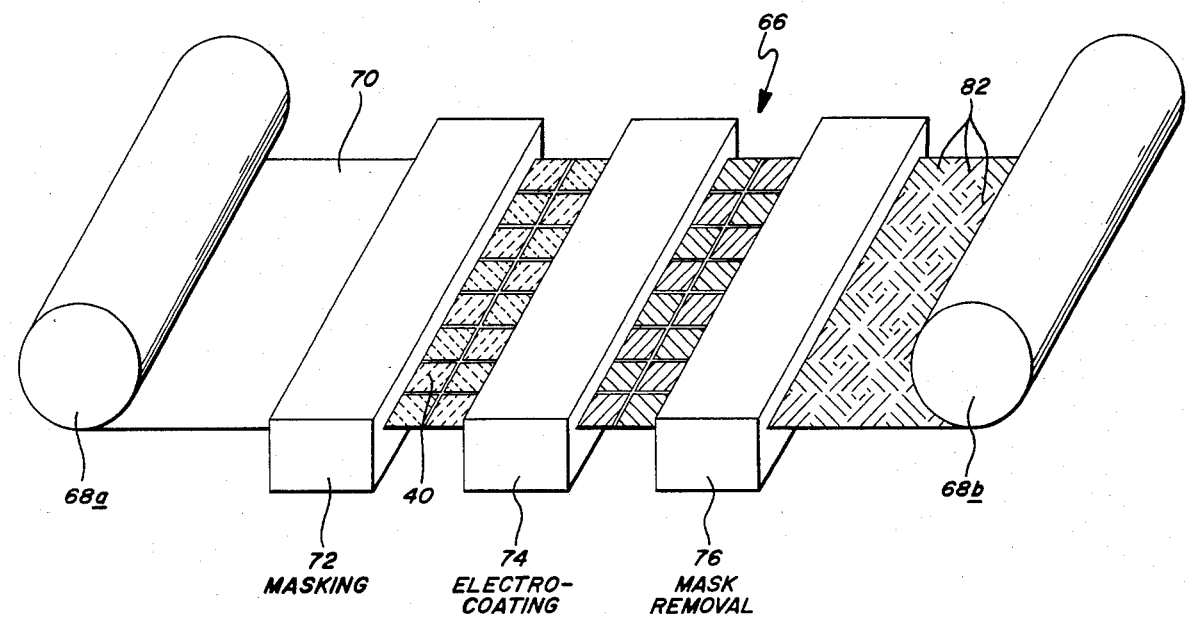
FIG. 5A is a perspective view of apparatus adapted to continuously electro-coat a preselected pattern onto an elongated web of semiconductor devices.

The method of the instant invention is readily adaptable to continuous processing. Referring now to FIG. 5A, an apparatus for continuoulsy electro-coating a patterned deposit onto a semiconductor device in a continuous roll-to-roll process is shown generally by the reference numeral 66. Apparatus 66 can be readily adapted to provide a grid pattern on large area photovoltaic devices, such as the solar cell illustrated in FIG. 2. The apparatus includes (1) a supply roller 68a, about which a continuous web 70 of the semiconductor devices to be coated are wound, (2) a take-up roller 68b, about which the coated web is wound; (3) a mask application station 72; (4) the electro-coating station 74; and (5) the mask removal station 76.

In operation, the web 70 of semiconductor devices is continuously advanced from the supply roller 68a to the mask application station 72, where a resist pattern 40 is applied thereonto. The resist pattern 40 may be formed by any well known process in the manner previously described. The mask application station 72 may also include necessary ancillary equipment, such as drying equipment to provide proper formation of the resist pattern 40. The web 70 is then advanced to the electro-coating station 74, where coating material is deposited upon the unmasked portions thereof.

Figure 5B:
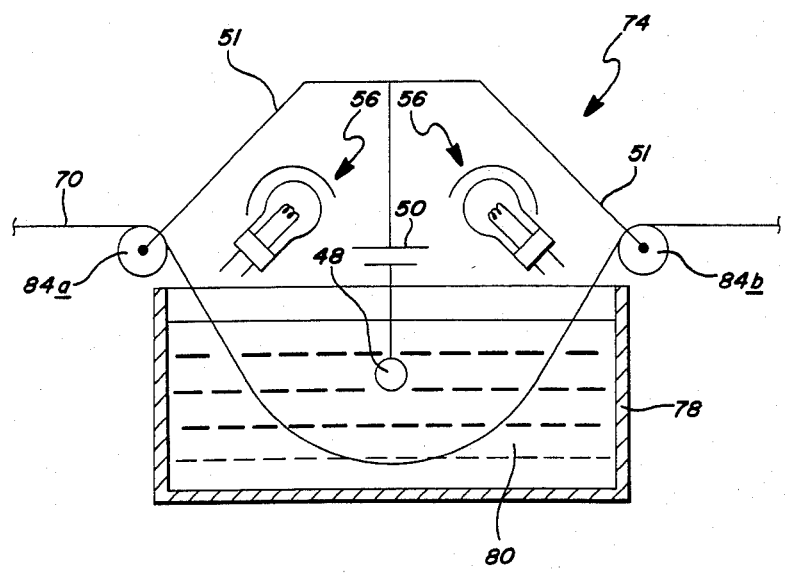
FIG. 5B is a schematic front elevational view, in cross section, of the electro-coating station of the apparatus depicted in FIG. 5A, as adapted to continuously form an electro-coated deposit upon an elongated web of semiconductor devices passing therethrough.

FIG. 5B depicts a preferred embodiment of the electro-coating station 74 as constructed in accordance with the principles of the instant invention. The station 74 includes a tank 78 containing an electrolyte solution 80, adapted for the particular electro-coating process being implemented. The web of semiconductor devices 70 is guided through the electrolyte solution 80 by a pair of guide rollers 84a, 84b, although other guide means such as magnets could be utilized. Electrical contact to the back surface of the web is affected by the guide rollers 84a and 84b, which rollers are electrically connected via wires 51 to a power source, such as a battery 50. Obviously, electrical contact with the moving web 70 may be established by other means well known in the art, such as sliding contracts. The electrical circuit is completed by an electrode 48 immersed in the electrolyte solution 80. As previously described, the composition of the electroltye 80, the quantity and polarity of the plating current, and the composition of the electrode 48 is dependent upon the material selected for electro-coating onto the surface of the semiconductor devices.

The electro-coating station 74 also incudes one or more sources of illumination 56, adapted to activate the photoactive junction of the web of semiconductor devices 70. The illumination must be of a wavelength and intensity to activate the junction for generating electro-coating current without harming the device, while simultaneously being of sufficient intensity to initate a flow of electrical current through the semiconductor device sufficient to deposit a desired thickness of material as the web 70 passes through the electro-coating station 74. As is readily apparent, (1) the amount of electrical current flowing through the semiconductor devices formed on the web 70 is dependent upon the illumination and the power provided thereto. The thickness of the electro-coated deposit will depend upon the amount of current flowing through the device and the transit time of the web 70 through the electro-coating station 74. Thus, by choosing the proper combination of illumination, power and web speed, the thickness of the electro-coated deposit may be controlled.

Returning to FIG. 5A: after leaving the plating station 74, the web of semiconductor devices 70 is advanced to the mask removal station 76 for the removal of the resist pattern therefrom so as to leave the electro-coated pattern 82 on the surface of the p-n junction devices. While this station may comprise, for example, a tank of solvent through which the web 70 continuously passes the exact nature of the mask removal station is dependent upon the masking material employed. After removal of the mask, the patterned web of semiconductor devices is wound about the take-up roll 68b for storage or further processing.

While the foregoing detailed description of a continuous electro-coating process (1) employed an electro-coating resist to delineate the pattern coated onto the web 70 and (2) relied upon an externally applied electrical current to effect the coating process, the instant invention is not so limited. For example, and as detailed hereinabove, the web of semiconductor devices 70 may be patterned by a projection process which utilizes an optical system adapted to project an image of the pattern in positional registration with the moving web 70 as it passes through the electro-coating station 74. Alternatively, the entire first surface of the web of semiconductor devices 70 may be electro-coated, and the pattern formed by subsequent masking and etching steps. Furthermore, the continuous process may operate in a self-energized mode in which the semiconductor devices formed on the web 70 provide sufficient photo-generated current under illumination to perform the electro-coating operation.

Without departing from the essence of the instant invention, a diversity of patterned structures of various compositions may be deposited upon semiconductor devices. FIGS. 6A–6E illustrate, in diagrammatic form, possible configurations attainable utilizing the inventive method described herein.

Figure 6A:
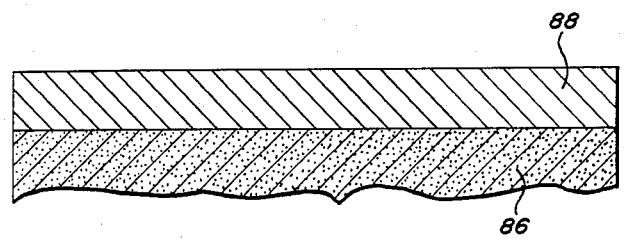
FIG. 6A is a fragmentary, cross-sectional view of a semiconductor device having a continuous homogeneous layer electro-coated thereupon by the method of the instant invention.
Figure 6B:
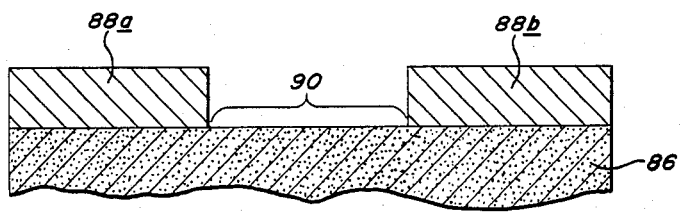
FIG. 6B is a fragmentary, cross-sectional view of a semiconductor device having a discontinuous homogeneous layer electro-coated thereupon by the method of the instant invention.

FIG. 6A depicts a semiconductor device 86, having a continuous, homogeneous layer 88 deposited upon the exposed surface thereof. The semiconductor device 86, may be any device which incorporates a photoresponsive junction therein. As used herein, the term "continuous" refers to a layer, such as 88, which is generally coextensive with the upper surface of the device 86; i.e., the layer covers substantially the entire surfac e of the device 86, and includes no gaps, breaks or voids therein. As used herein, the term "homogeneous" refers to a layer such as 88 which is of substantially uniform composition. The homogeneous layer 88 may be a layer of electrically conductive material, semiconductor material, or insulating material. Said homogeneous layer 88 may comprise a single element or it may be a compound of two or more elements. The structure depicted in FIG. 6B is generally similar to that shown in FIG. 6A, however the homogeneous layer 88 is discontinuous and formed of a plurality of segments, shown as segments 88a and 88b. As used herein, the term "discontinuous segments" refers to a layer of electro-coated material which does not extend across the entire exposed surface of th semiconductor device 86. The device, rather, includes uncoated regions 90 on the exposed surface thereof, not covered by the electro-coated material. The discontinuous layer includes, by way of illustration, grid patterns, busbars, contact patterns, and the like.

Figure 6C:
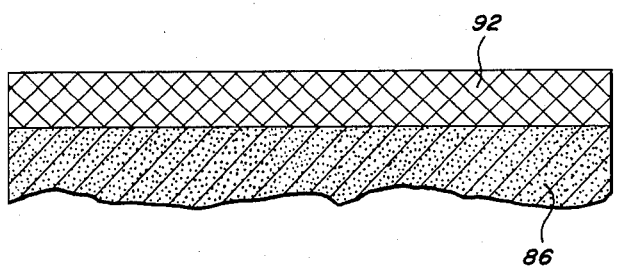
FIG. 6C is a fragmentary, cross-sectional view of a semiconductor device having a continuous heterogeneous layer electro-coated thereupon by the method of the instant invention.

FIG. 6C depicts a typical semiconductor device 86 having a continuous heterogeneous layer of electro-coated material deposited upon the exposed surface thereof. As used herein "heterogeneous" refers to a material having a composition that varies spatially. This definition includes structures (1) formed by a plurality of layers of different materials deposited atop one another, (2) having side-by-side regions of different compositions such as alternating strips of different materials, and (3) having micro-heterogeneous features, as, for example, composite materials and alloys having admixed regions of differing compositions. FIG. 6E is generally similar to FIG. 6C, except that it depicts a discontinuous heterogeneous layer deposited atop a semiconductor device 86. The device 86 and the heterogeneous material deposited thereupon are generally similar to that depicted in FIG. 6C, however, the material is electro-coated in a discontinuous pattern, i.e., the heterogeneous layer includes a plurality of regions 92a and 92b, between which uncoated regions 90 are formed upon the exposed surface of the semiconductor device 86.

Figure 6D:
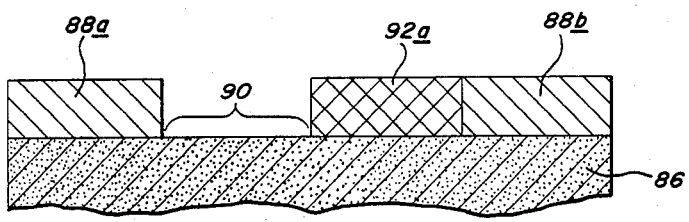
FIG. 6D is a fragmentary, cross-sectional view of a semiconductor device having a discontinuous layer with homogeneous and heterogeneous regions electro-coated thereupon by the method of the instant invention.
Figure 6E:
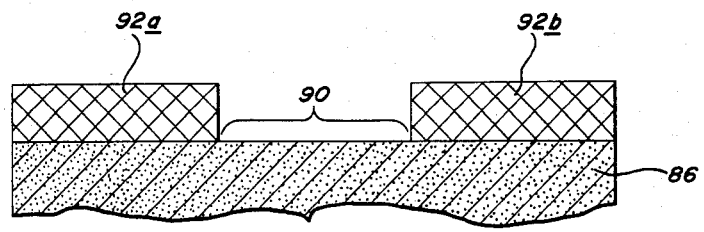
FIG. 6E is a fragmentary, cross-sectional view of a semiconductor device having a discontinuous heterogeneous layer electro-coated thereupon by the method of the instant invention.

The structure depicted in FIG. 6D may be regarded as a hybrid of the structure of FIG. 6B and FIG. 6E. Depicted in FIG. 6D is a discontinuous layer of electro-deposited material having homogeneous regions 88a and 88b, as well as heterogeneous regions, such as 92a, deposited atop a semiconductor device 86. As in FIGS. 6B, and 6E, electro-coated regions 88a, 88b and 92a define uncoated regions such as 90 upon the exposed surface of the semiconductor device 86.

While the foregoing describes the electro-coating process of the instant invention in general terms, the following examples will serve to more fully demonstrate the operation and the advantages of the method of the instant invention.

EXAMPLE 1

Nickel was electroplated in a preselected pattern onto the exposed indium tin oxide surface (the TCO surface) of an amorphous silicon alloy p-i-n photovoltaic device, generally similar to the photovoltaic cell shown in FIG. 1. The procedure is as follows. The exposed indium tin oxide surface of the photovoltiac device was cleaned, rinsed in deionized water and electrical contact was made to the stainless steel substrate layer thereof by cementing a spot of electrically conductive epoxy adhesive to a contact wire. The photovoltaic device so prepared was then immersed into a mild (approximatey 10%) sulfamic acid solution for 5 seconds and thereafter placed in a nickel sulfamate plating bath which was maintained at a temperature of approximately 50° centigrade with a pH of approximately 4. The nickel sulfamate bath is a commercially available product supplied by the Allied-Kelite Division of the Witco Chemical Company. A 200 watt tungsten filament lamp was positioned outside the plating bath, at a distance of approximately 10 cm from the photovoltaic device, so as to illuminate the light incident surface thereof during the plating operation. An electrical current of approximately 0.1 amperes at a bias of approximately −1 volt was applied to the four square inch sample device, thus providing an effective current density of 10 milliamps per square centimeter. The current flowed through the device for approximtely one minute resulting in a nickel layer being electroplated onto the TCO material. The electroplated nickel layer exhibited good adhesion, good electrical conductivity, a smooth surface and was approximately 0.2 microns thick. Of equal importance, no damage occurred to the cells of the photovoltaic device during the course of the plating process.

EXAMPLE 2

Copper was electroplated in a preselected pattern onto the exposed indium-tin-oxide surface (the TCO layer) of a p-i-n photovoltaic device which was generally identical to the sample utilized in Example 1. The device was cleaned, rinsed, electrically connected to an electrical current source, and immersed into a sulfamic acid solution as in the foregoing example. After the sulfamic acid immersion, the photovoltaic device was dipped into a copper sulfate plating bath, and illuminated as in Example 1. The copper sulfate plating bath, supplied by the Allied-Kelite Division of the Witco Chemical Company, was maintained at room temperature with a pH of approximately 1. An electrical current of approximately 0.1 amperes at a bias of −1 volts was passed through the bath. The sample again was about 4 square inches in area, and developed a current density of approximately 10 milliamps per square centimeter. The electrical current flowed through the photovoltaic device for 1 minute and resulted in an electroplated layer of approximately 0.2 microns thickness. The copper-plated layer exhibited good adhesion, high electrical conductivity, and a smooth surface. Again no damage to the cells of the photovoltaic device occurred.

EXAMPLE 3

In this example an electrically conductive multi-layer sandwich was deposited in a preselected pattern upon each exposed surface of the electrically isolated indium-tin-oxide segments (the TCO layer) of a large area photovoltaic device, generally similar to the photovoltaic device depicted in FIG. 2 and described supra. The large area photovoltaic device first had a resist pattern deposited onto the exposed surface of the indium-tin-oxide thereof, said pattern defining non-resist covered areas corresponding to the grid pattern to be plated. After applying the resist-coating layer, the device was washed with a mild detergent, rinsed, had an electrical contact affixed to the common electrically conductive substrate thereof, and was dipped in sufamic acid (as per the previous two examples). The prepared device was then placed in a nickel sulfamate electroplating bath maintained at 40° Centigrade, with a pH of approximately 4, and illuminated as in the foregoing examples. A current of 25 milliamps at $-1$ volt bias was passed through the photovoltaic device for approximately one minute, resulting in a current of 15 milliamps per square centimeter flowing through the unmasked portions of the device. The flow of current and the illumination were terminated, the sample was rinsed in deionized water and then immersed in a copper sulfate plating bath which was maintained at room temperature and a pH of approximately 1. The photovoltaic device was again illuminated and an electrical current of 25 milliamps at $-0.25$ volts bias was passed through the device for one minute providing an effective current density of approximately 15 milliamps per square centimeter. The current and the illumination were terminated, the sample was rinsed in deionized water, then reimmersed in the the previously used nickel sufamate bath, and reilluminated. At a bias of $-1$ volts, a current of 25 milliamps flowed through the device for one minute, providing an effective current density of 15 milliamps per square centimeter. Upon completion of the foregoing electroplating steps, the illumination was terminated, the device was disconnected from the source of electrical current, rinsed and dried. The resulting tri-layer nickel-copper-nickel grid pattern deposited upon the exposed indium-tin-oxide surface of the photovoltaic device exhibited good adhesion, high electrical conductivity and presented a smooth surface. As with the previous examples, the small area photovoltaic cells of the large area photovoltaic device were not harmed.

EXAMPLE 4

In this example, a pattern was anodized atop an iron electrode layer previously deposited atop a single amorphous silicon pin device. The device was cleaned by washing with acetone, and a resist pattern was applied atop the exposed surface of the iron electrode layer by utilizing MacuMask 9251-M manufactured by the McDermid Corporation, the non-resist covered portion of the surface defining the regions of the iron electrode to be anodized. Next, the resist coated device was immersed for 10 minutes into an aqueous solution of 0.5 molar $FeCl_3$ and maintained at 50° C. The device was then placed in an oxidizing bath of 10% $CrO_3$ in water at room temperature, and illuminated by a 500 W tungsten-halogen lamp positioned approximately 5 cm from the device. An anodization current of 50 milliamps was provided to the device for 30 minutes, and resulted in a coating current of approximately 20 milliamps per $cm^2$ flowing through the unpatterned portions of the p-n junction device. Once anodization was complete, illumination was terminated, electrical current was terminated and the device was removed from the electrolyte bath and rinsed. This treatment resulted in the formation of a 2.0 micron thick coating of iron oxide upon the unmasked portions of the device.

While the foregoing examples describe the use of nickel or copper plating baths or the anodization of iron, electro-coating processes utilizing other materials also fall within the scope of the instant invention. For example, gold, silver, chromium or the like could be electroplated according to the principles enumerated herein, and similarly oxide coatings, nitride coatings and the like may be anodically formed on metal or semiconductor layers. While the examples, and the foregoing specification generally discussed the electro-coating of silicon containing materials, the instant invention is obviously not so limited, but may be utilized to electro-coat any semiconductor devices which include photoresponsive junctions therein, be those devices formed from germanium, cadmium sulfide, gallium arsenide, gallium aluminum arsenide and the like, whether such devices are amorphous, crystalline or polycrstalline.

The foregoing description and examples are merely illustrative of the utility of the instant invention, and are not intended as limitations thereon. It is the claims which follow, including all equivalents which define the scope of the invention.

What we claim is:

1. An improved method of electro-coating a preselected pattern upon a first surface of a semiconductor device, said semiconductor device including photoresponsive junction means disposed between the first surface and a second surface thereof, the method including the step of:
   disposing said semiconductor device in an electro-coating apparatus which includes an electrolyte bath;
   illuminating said semiconductor device for activating the photoresponsive junction means; and
   providing electrical current, from a source external to said semiconductor device, to the second surface of said semiconductor device, said activated photoresponsive junction means providing for the flow of electrical current from the second surface through said photoresponsive junction and to the first surface of said semiconductor device, whereby a pattern electro-coated deposit is formed upon the first surface of the semiconductor device without damaging said photoresponsive junction thereof.

2. A method as in claim 1, including the further step of depositing electroplated material upon the first surface of said semiconductor device.

3. A method as in claim 1, including the further step of anodically oxidizing the first surface of said semiconductor device so as to form an oxidized pattern thereupon.

4. A method as in claim 2, including the further step of selecting the electroplated material from the group consisting essentially of: aluminum, copper, nickel, gold, silver, molybdenum, chromium, titanium, lead, tin and mixtures thereof.

5. A method as in claim 1, including the further step of electro-coating a plurality of successively deposited layers.

6. A method as in claim 5, including the further step of electroplating successive layers of copper and nickel.

7. A method as in claim 5, including the further step of electroplating successive layers of silver and titanium.

8. A method as in claim 1, including the further step of electro-coating a pattern selected from the group consisting essentially of:
 (a) a continuous, homogeneous layer;
 (b) a discontinuous homogeneous layer;
 (c) a continuous, heterogeneous layer;
 (d) a discontinuous, heterogeneous layer;
 (e) a discontinuous layer with homogeneous and heterogeneous regions; and
 (f) combinations thereof.

9. A method as in claim 3, including the further step of selecting the first surface of said semiconductor device from the group consisting essentially of silicon, aluminum, and germanium.

10. A method as in claim 1, further comprising the step of:
 providing a non-continuous electro-coating resist layer atop said semiconductor device so as to define a pre-selected pattern for subsequently receiving an electo-coated deposit thereupon.

11. A method as in claim 1, further comprising the steps of:
 providing an etchant resist layer atop those portions of said electro-coated deposit which correspond to the preselected electro-coated pattern; and,
 etching the electro-coated deposit not covered by the etchant resistant layer, whereby the preselected electro-coated pattern is formed upon said semiconductor device.

12. A method as in claim 1, including the further steps of: providing an elongated web of substrate material, to form the second surface of said semiconductor device; and
 continuously advancing said elongated web through the electro-coating apparatus, whereby said apparatus is adapted to continuously electro-coat the first surface of said semiconductor device as it passes therethrough, the thickness of the electro-coated deposit being proportional to the transit time of any portion of the semiconductor device through the electro-coating apparatus.

13. A method as in claim 1, wherein said flow of electrical current corresponds to the intensity and duration of the illumination, whereby the thickness of the electro-coated deposit, and the rate of deposition thereof, may be controlled by controlling the illumination of the semiconductor device.

14. A method as in claim 1, including the further step of providing a crystalline semiconductor device for forming an electro-coated deposit thereupon.

15. A method as in claim 1, including the further step of providing a thin film semiconductor device for forming an electro-coated deposit thereupon.

16. A method as in claim 1, including the further step of providing an amorphous semiconductor device for forming an electro-coated deposit thereupon.

17. A method as in claim 16, wherein said amorphous semiconductor device is an amorphous silicon alloy photovoltaic device having a transparent conductive layer which comprises the first surface thereof; the method including the further step of electroplating a metallic deposit upon the transparent conductive layer of the photovoltaic device.

18. A method as in claim 1, wherein said photoresponsive junction means is a p-n junction; the method including the step of activating the p-n junction.

19. A method as in claim 1, wherein said photoresponsive junction means is a Schottky barrier junction; the method including the step of activating the Schottky barrier junction.

20. A method as in claim 1, wherein said photoresponisve junction means is a metal-insulator-semiconductor junction; the method including the step of activating the metal-insulator-semiconductor junction.

21. A method as in claim 1, wherein said semiconductor device includes a plurality of photoresponsive junctions; the method including the step of activating the plurality of photoresponsive junctions.

22. A method as in claim 1, wherein said photoresponsive junction means includes a p-i-n type junction; the method including the step of activating the p-i-n junction.

23. A method as in claim 1, including the further steps of:
 providing the electrical current for a time sufficient to form a desired thickness of the electro-coated deposit;
 terminating the electrical current; and
 terminating the illumination.

24. An improved method of electro-coating a preselected pattern upon a first surface of a semiconductor device, said semiconductor device including photoresponsive junction means disposed between, and generally co-planar with, the first surface and a second surface thereof, the method incluidng the steps of:
 disposing said semiconductor device in an electro-coating apparatus which includes an electrolyte bath;
 illuminating only those portions of the semiconductor device corresponding to the preselected pattern so as to form an illuminated image on the first surface thereof; and
 providing a flow of electrical current, from a source external to said semiconductor device, to the second surface of the semiconductor device, said illuminated portions of the semiconductor device adapted to activate said photoresponsive junction means to provide for the flow of electrical current from the second surface thereof through said photoresponsive junction of said illuminated portions to superadjacent portions of the first surface corresponding to the preselected pattern, whereby a pattern electro-coated deposit is formed upon the first surface of the semiconductor device without damaging said photoresponsive junction thereof.

25. A method as in claim 24, including the further step of providing an elongated web of substrate material to form the second surface of the semiconductor device;
 continuously advancing the elongated web through the electro-coating apparatus; and
 maintaining the illuminated image in registration with the advancing web of material, whereby patterned electro-coated deposites are continuously formed.

26. A method as in claim 25 comprising the further step of utilizing the electro-coated pattern formed thereby as a strike layer in a subsequent electro-coating process.

27. A method as in claim 25, wherein said photovoltaic junction means is a p-n junction; the method including the step of activating the p-n junction.

28. A method as in claim 25, wherein said photovoltaic junction means is a Schottky barrier junction; the method including the step of activating the Schottky barrier junction.

29. A method as in claim 25, wherein the semiconductor device includes a plurality of photovoltaic junctions; the method including the step of activating the plurality of photovoltaic junctions.

30. A method as in claim 25, wherein said photovoltaic junction means includes a p-i-n junction; the method including the step of activating the p-i-n junction.

31. A method as in claim 25, including the further step of providing an elongated web of substrate material to form the second surface of the semiconductor device; continuously advancing said elongated web through the electro-coating apparatus, whereby said apparatus is adapted to continuously electro-coat the first surface of the semiconductor device as it passes therethrough, the thickness of the electro-coated deposit being proportional to the transit time of any portion of the semiconductor device through the electro-coating apparatus.

32. A method as in claim 25, including the further step of providing an elongated web of substrate material to form the second surface of the semiconductor device; continuously advancing the web through the electro-coating apparatus; and, maintaining the projected illuminated image in registration with the advancing web of material, whereby patterned electro-coated deposits are continuously formed.

* * * * *